United States Patent [19]

Bok

[11] Patent Number: 4,662,987

[45] Date of Patent: May 5, 1987

[54] METHOD OF DOUBLE FLOATING TRANSPORT AND PROCESSING OF WAFERS WITHIN A CONFINED PASSAGEWAY

[75] Inventor: Edward Bok, Badhoevedorp, Netherlands

[73] Assignee: Integrated Automation, Limited, Tortola, British Virgin Isls.

[21] Appl. No.: 862,354

[22] PCT Filed: Jul. 31, 1985

[86] PCT No.: PCT/NL85/00032

§ 371 Date: Mar. 25, 1986

§ 102(e) Date: Mar. 25, 1986

[87] PCT Pub. No.: WO86/01034

PCT Pub. Date: Feb. 13, 1986

[30] Foreign Application Priority Data

Aug. 1, 1984 [NL] Netherlands ........................ 8402410

[51] Int. Cl.[4] .................... B44C 1/22; C03C 25/06; C03C 15/00; H01L 21/306

[52] U.S. Cl. .................................... 156/646; 156/345; 156/643

[58] Field of Search ............... 156/345, 643, 646, 639; 226/97; 406/86, 88, 89; 427/38, 39; 204/192 E, 258

[56] References Cited

U.S. PATENT DOCUMENTS

| | | | |
|---|---|---|---|
| 4,495,024 | 1/1985 | Bok | 156/646 |
| 4,521,268 | 6/1985 | Bok | 156/345 |
| 4,544,446 | 10/1985 | Cady | 156/639 |
| 4,560,590 | 12/1985 | Bok | 427/294 |

FOREIGN PATENT DOCUMENTS 37293 4/1981 Japan .

Primary Examiner—William A. Powell
Attorney, Agent, or Firm—David H. Semmes; Warren E. Olsen

[57] ABSTRACT

Method of transporting and processing of substrates, including wafers of the type used for semiconductors. Particularly, a method of flowing fluid medium longitudinally within a confined passageway so that the substrate is supported, transported and processed in a double floating condition without touching the walls of the passageway. The method is characterized by the restricting of flowing of fluid medium into the passageway, so as to guide the substrate during transport and processing by injecting pressurized coating medium into the passageway at a series of processing stations defined intermediate transport sections of said passageway.

6 Claims, 15 Drawing Figures

METHOD OF DOUBLE FLOATING TRANSPORT AND PROCESSING OF WAFERS WITHIN A CONFINED PASSAGEWAY

In the Dutch Patent Application Nos. 8 103 979, 8 22 753 and 8 203 318 of applicant installations with double-floating transport and processing of substrates and tape are described.

Thereby in a narrow tunnel passage the wafer transport and processing takes place under double-floating condition by means of a fluid medium, with the changing thereof into a gaseous medium and oppositely.

To remove such fluid medium from the wafer by means of gaseous medium it is required, that the width of the gap in between the wafer and the lower block and respectively upper block be relatively large, f.i. 0,5–1.5 mm, to prevent such a sticking of the wafer against such block, such that the gaseous medium is not able to remove this fluid medium effectively.

As a result, the consumption of medium and in particular of gaseous medium for such wafer transport and processing has to be considerable.

In addition, provisions, such as flow restrictors, have to be located in the medium supply channels as a need to prevent a moving of the wafer from the vertical centre of the tunnel passage towards the upper- or lower block, because in that case the balance in forces of both sides of the tunnel passage, acting on the wafer, can easily be disturbed.

With the installation according to the present invention these objections are removed, whereby it is mainly characterized by having recesses in the main portion of the block sections aside the supply channels for the medium, said recessed areas providing an increased height of the tunnel passage.

Another very positive feature is, that an elevated wall aside such recess is located in between that recess and the medium discharge channel.

Thereby a difference in height between the top of such sidewall and the recessed portion of 1 mm with a minimum size of such tops which is essential for some processings.

Furthermore, a combination of supply and discharge channels is possible, wherein in the direction of wafer movement in succession two supply channels are arranged with in between a separation wall and whereby the medium flows towards discharge channels, positioned on each side of such a combination of supply channels.

Thereby flows of medium, moving in opposite directions, are accomplished to enable an optimal control of the wafer transport and processing.

Another positive feature is, that such elevated walls in between both supply channels also have a height, that at least is almost the same as that of the separation wall in between such recess and the discharge channel.

In the upper and lower block the mouthes of a plurality of medium supply channels are arranged aside each other in a lateral direction over almost the entire passage width, whereas in each such block the groups of discharge channels also are arranged in a lateral direction.

A following very positive feature of the installation is that the separation wall in between such groups of supply and discharge channels extends in a lateral direction over at least almost the entire tunnel width.

A following positive feature is, that the sidewall in between the small top and the lower base is inclined.

During the moving of the medium in the passage cap aside the wafer, this medium is urged to move along the top of such side wall towards the discharge channel, with an increased pressure in the recesses.

As a result, an increased thrust of the medium on the wafer is accomplished and such thrust is in a direction, desired and under an ideal double-floating condition for such wafer.

Another positive feature is, that such elevated separation walls in between the supply and discharge channels are recessed to enable increased flows of medium in the direction, desired.

The separation walls, extending in a lateral direction, can be connected with each other by means of walls, having approximately the same height and extending in a longitudinal direction with respect to the tunnel passageway.

These walls minimize the escape of medium from the recesses in a lateral direction.

Furthermore, the two groups of supply channels aside the lateral centre of the tunnel have an inclined position with regard to this tunnel in order to accomplish a moving of the wafer through this lateral centre of the tunnel passage.

In addition, these channels can be inclined in such way, that the escaping medium provides a thrust on the wafer in both lateral and longitudinal direction.

It is often required, that during the wafer processing this wafer rotates to enable a uniformity thereof.

A following positive feature is now, that two groups of recesses are arranged in lateral direction aside the centre of the tunnel and each group is provided with such recesses in their elevated sidewalls, that medium, escaping from these groups of recesses in a opposite direction, accomplish a rotation of the wafer.

Such groups of supply channels aside the lateral centre can have a separate medium supply, whereby by varying such supplies during the wafer rotation this wafer oscillates in lateral direction with an amplitude, depending upon the type of processing.

Other positive features and characteristics follow from the description, as illustrated in the accompanying drawings.

Figure 14A:
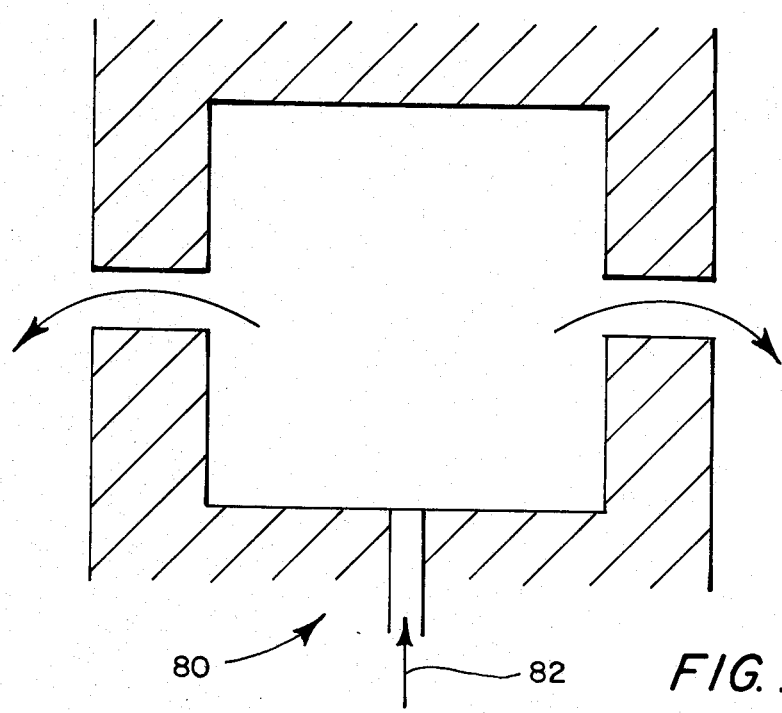
Figure 14B:
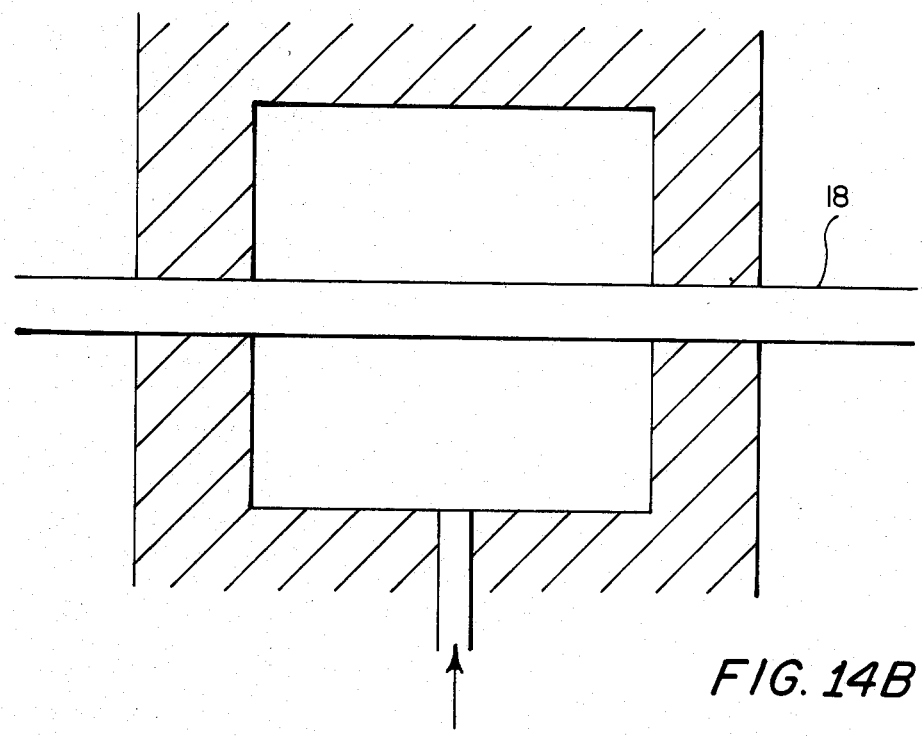

FIG. 14$^A$, a fragmentary vertical section shows a detection system for the wafer position by means of variable medium flows.

FIG. 14$^B$, a fragmentary vertical section shows the system according to FIG. 14A with the wafer in the detection area.

Figure 1:
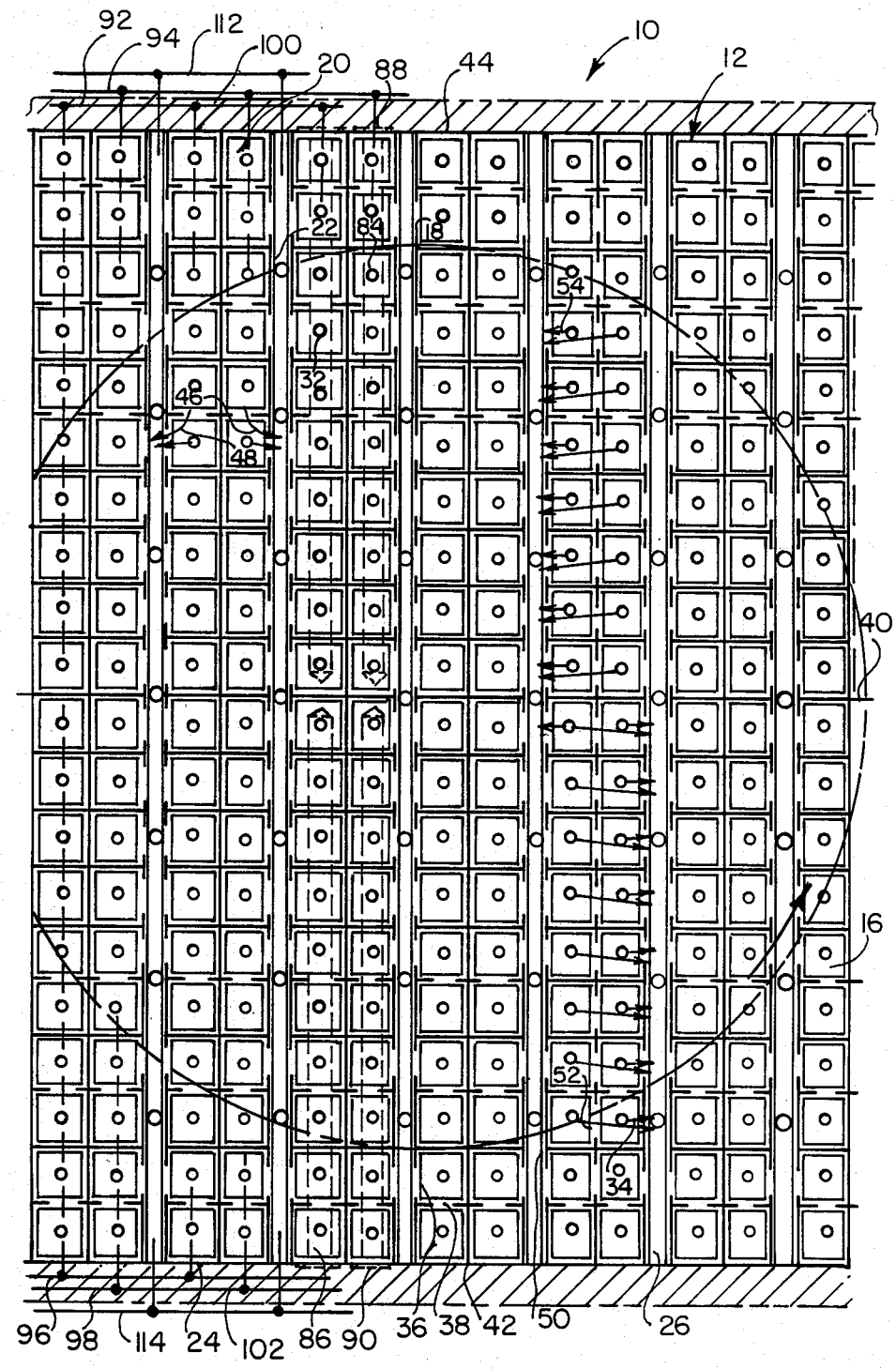
FIG. 1 is in part of a top plan of the lower tunnel section of the installation according to the invention.
Figure 3:
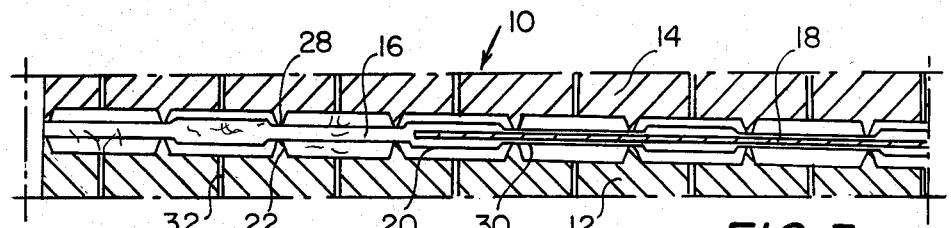
FIG. 3 is a vertical section taken along line 3—3 of FIG. 2.

In FIG. 1 of installation 10 the lower block 12 is shown. Thereby the upper block 14, see also FIGS. 3, 4 and 5, has an identical structure, with in between these blocks the narrow tunnel passageway 16 for a double-floating transport and processing of wafers 13.

Block 12 is provided with a plurality of recesses 20, surrounded by the elevated walls 22.

Figure 2:
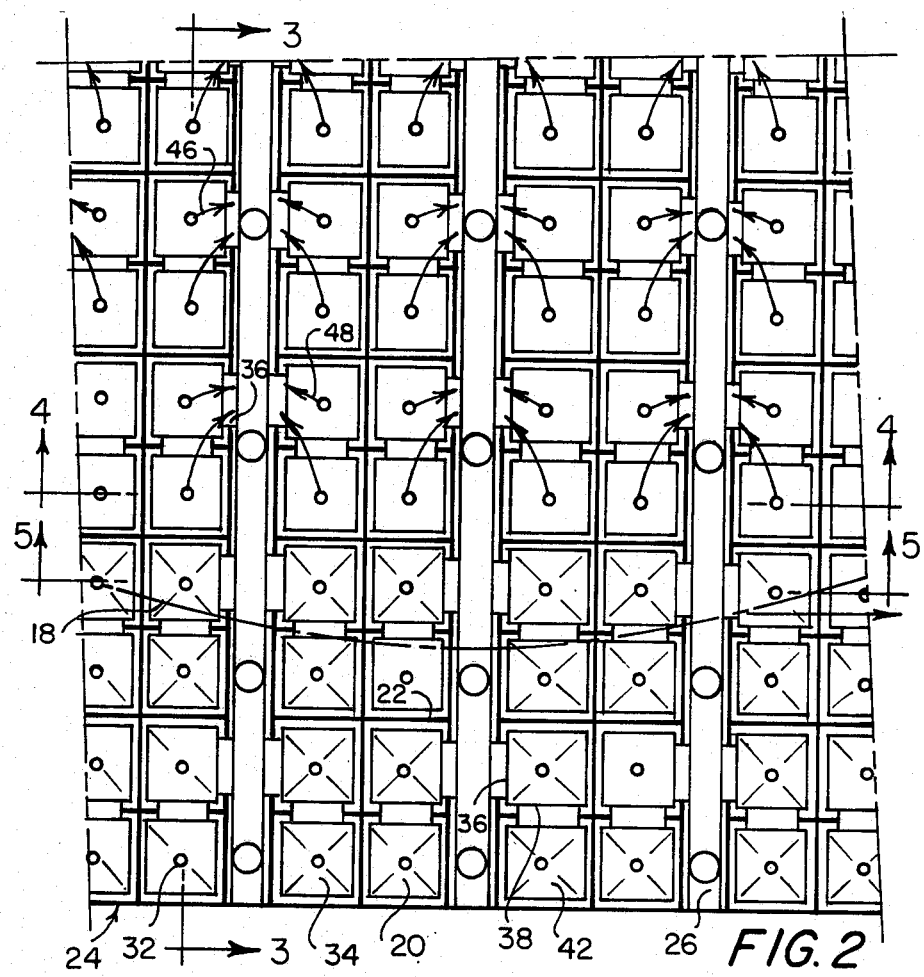
FIG. 2 is an enlarged fragmentary plan of the installation according to FIG. 1, with a double-flow regulation of the medium for wafer transport and processing.

In FIG. 2 such recess structure of the section 24 is shown in detail.

Thereby in between successive discharge channels 26 two rows of recesses 20 are arranged aside each other and extend in lateral direction. The elevated sidewalls 22 extend in lateral direction of the tunnel passageway with the creation of the small sized passagewall sections 28, with the wafer passing along under double-floating condition, see also FIG. 11.

Thereby the gap 30 in between these wall sections 28 and the wafer 18 amounts only for instance 0.1 mm.

Through supply channels 32, having any size, position and inclination, medium 34 is urged towards recesses 20, whereby a discharge of this medium mainly can occur through recesses 36 and 38, having a height of for instance only 50 micrometer.

As illustrated in FIG. 1, through the recesses 38 medium 34 is directed towards the centre 40 of the tunnel passageway, and such in particular, if the related recess 20 is covered by a wafer 18.

Consequently, during transport and processing such wafer is urged towards a mid position in the tunnel and such without any touching of the sidewalls 42 and 44 of the tunnel.

Through recesses 36 medium 34 is urged towards the discharge channels 26. Thereby one group 46 of medium is displaced in the direction of movement of wafer 18, whereas the other group 48 of medium is displaced in an opposite direction, see FIGS. 2 and 4.

By regulating the supply of these groups of medium, the wafer can be moved in both longitudinal directions and with any velocity, desired.

Figure 6:
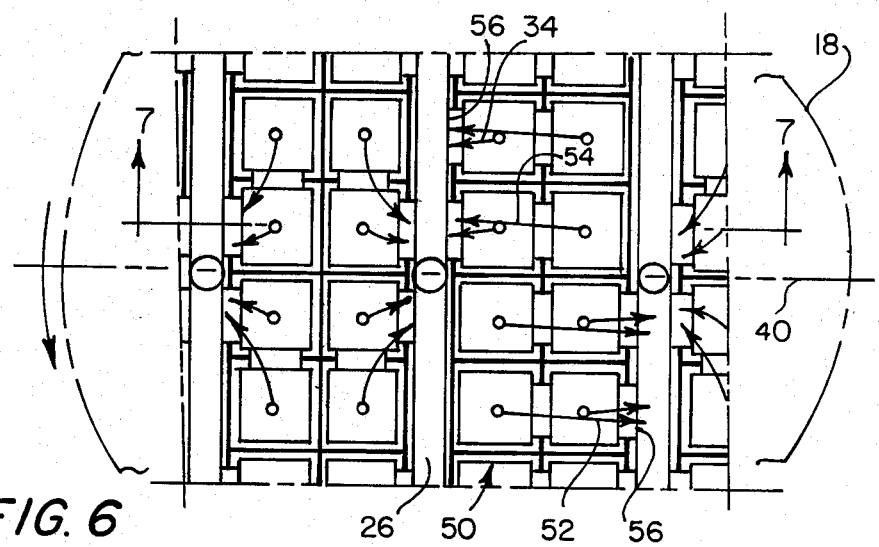
FIG. 6 is an enlarged fragmentary plan detail of the installation according to FIG. 1 at the centre of wafer rotation.
Figure 12:
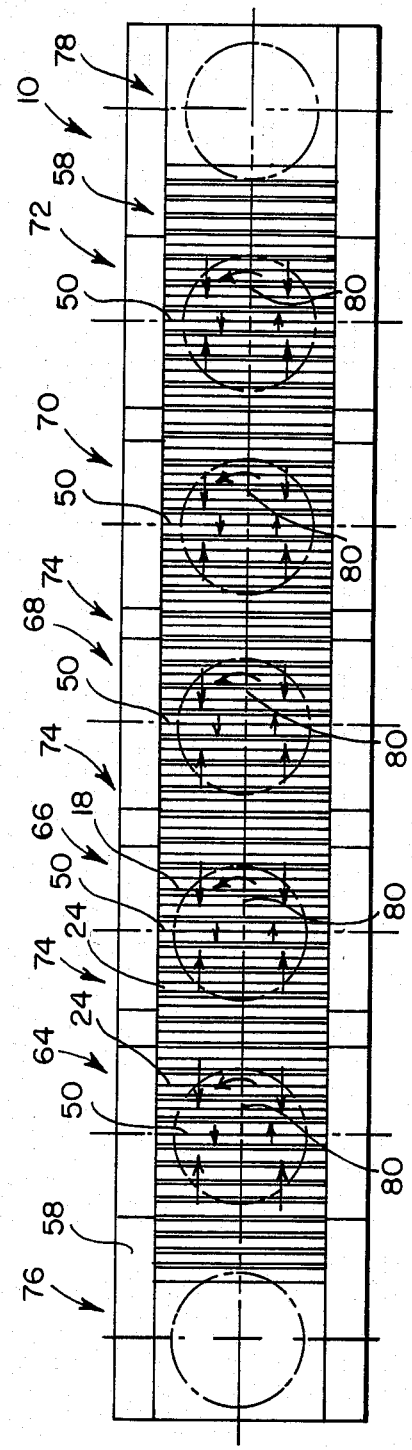
FIG. 12 shows schematically an installation according to the invention, provided with successive processing sections.

In section 50, see FIGS. 1, 6 and 12, in two groups 52 and 54, arranged on both sides of the centre 40, through recesses 56 medium 34 is urged to move in opposite direction along the wafer 18 towards the discharge channel 26, thereby accomplishing a rotation of the wafer.

By regulating the supply pressure for the medium of these groups, 52, 54 each rotational speed of the wafer is possible.

Figure 8:
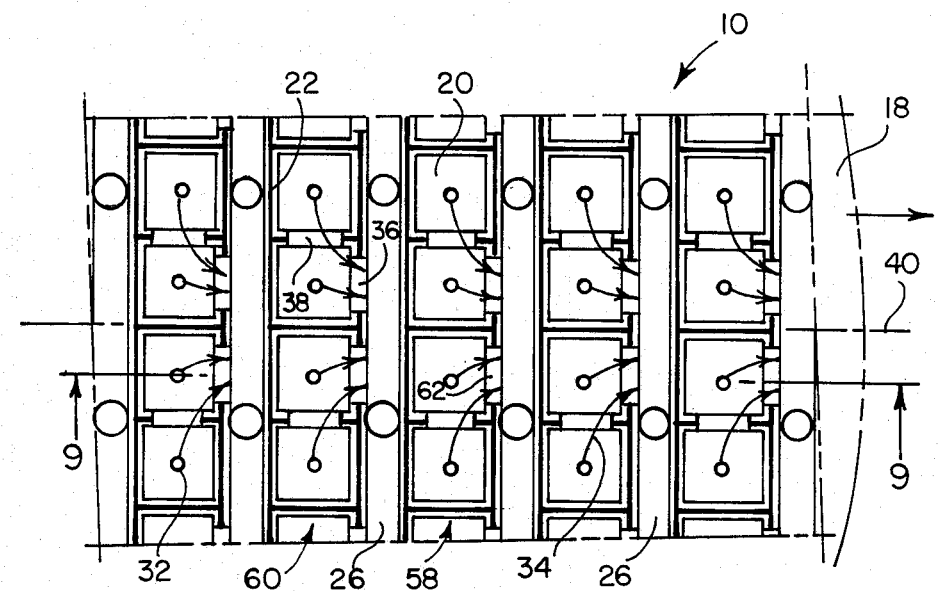
FIG. 8 is an enlarged fragmentary plan detail of the transport section of the installation according to FIG. 1.
Figure 13:
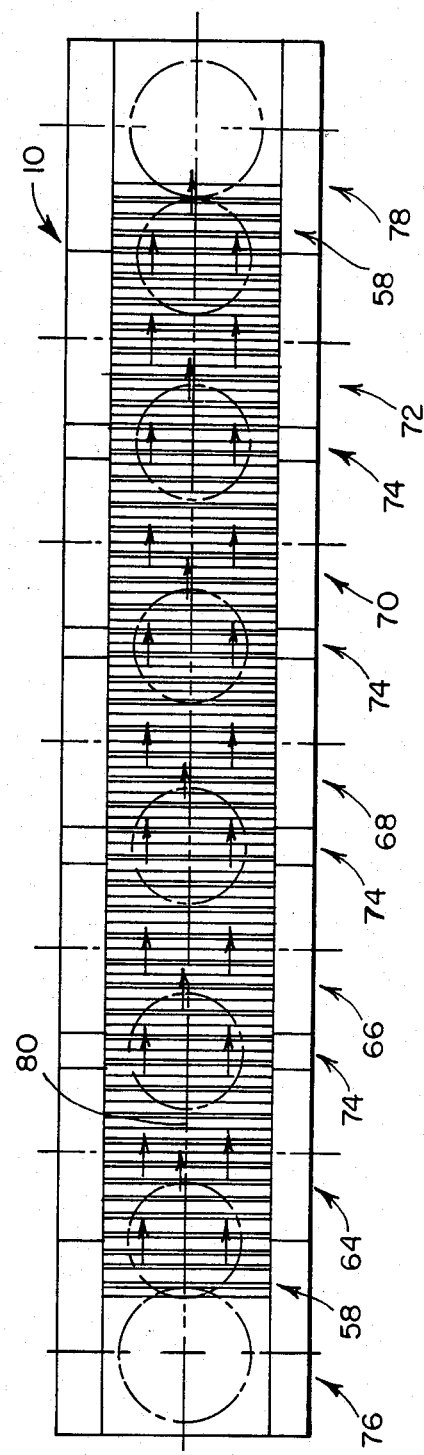
FIG. 13 is the installation according to FIG. 12 and illustrating the wafers moving from one processing section to a following processing section.

In the transport sections 58 of the installation, see FIGS. 8, 12 and 13, urging of medium 34 from groups 60 takes only place through recesses 62 towards the discharge channels 26 in direction of movement of the wafer 18.

Compared to the narrow wall sections 22, the recesses 20 have a relatively large surface, for instance 120 mm$^2$ compared to 10 mm$^2$, and can have a depth of for instance 0.5-2 mm, depending on the viscosity of the medium, used and the type of processing.

During transport and processing of the wafer 18 by means of fluid medium under pressure, this medium is not able to establish and maintain such surface tension, that the wafer sticks to one of the tunnel walls 28, and thereby obstructs the wafer transport and processing.

Medium, supplied from the recesses 20 along the passage walls and through the wall recesses 36, 38, 56 and 62, urges the wafer under double-floating condition towards a mid position in the tunnel.

Figure 10:
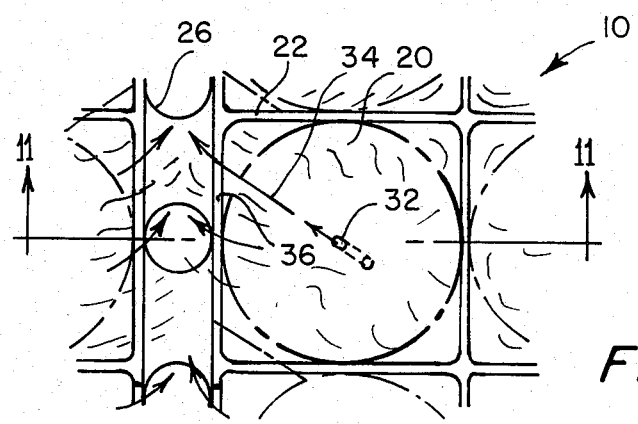
FIG. 10 is a fragmentary top plan of a tunnelwall recess of the installation according to FIG. 1.

Recesses 20 can have any profile and as is indicated in FIG. 10, can be circular to enable a less complicated machining of the blocks 12 and 14.

Furthermore, in the sidewalls 22 of such recess discharge recesses can be located such, that medium is urged along the wafer in both longitudinal direction of the tunnel and towards this centre of the tunnel.

Figure 11:
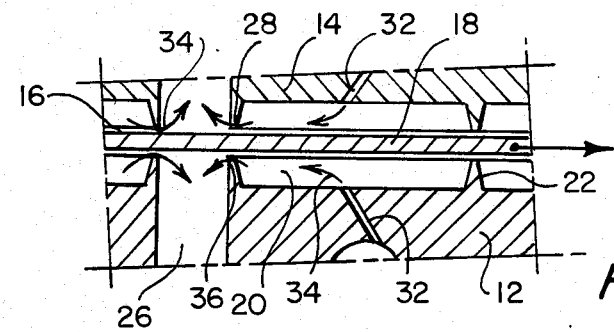
FIG. 11 is a vertical section taken along line 11—11 of the recess according to FIG. 10.

In addition, the diameter and number of the supply channels 32 per recess can differ and they are preferably placed in an inclined position as illustrated in FIG. 11.

In FIG. 12 installation 10 is shown with a number of processing sections and which, within the scope of the invention, can vary in number and type.

Thereby for instance in the successive processing sections during some time, for instance one minute, the following series of processing of wafers 18 takes place:

in section 64 the processing with H$_2$SO$_4$ under high temperature, for instance 100° C.;

in section 66 the rinsing with water;

in section 68 the etching by means of H.F.

in section 70 the rinsing with water; and in section 72 the spin drying.

After each such processing the wafer 18 is moved through transport sections towards the following processing section, whereby sensors 80 illustrated in FIG. 14$^A$, provide signals for changing the wafer transport into wafer processing and oppositely, as is indicated in FIGS. 12 and 13.

As illustrated in FIG. 12, the wafers are supplied by the supply dome 76, which is provided with a cassette unloader and ultimately enter the exit dome 78, provided with a cassette loader.

The structure of such domes is described in the Dutch Patent Application No. 8 401 777 of applicant. Within the scope of the invention other supply and discharge systems are possible for the wafers.

Furthermore, also tape can be fed through the installation.

In FIGS. 14$^A$ and 14$^B$ such sensor 80, working on differences in pressure of the medium, is shown.

If no wafer is present in the sensor area, as is indicated in FIG. 14$^A$, then the flow 82 of medium is maximal.

However, if in case the wafer is moved towards a position on top of this sensor, then the wafer almost entirely blocks this flow 82 of medium, whereby the increase in pressure, created in that way in the medium supply, results in an impulse for switching the flows of medium for wafer transport and processing.

During wafer transport the flows of medium result in thrusts in the direction of wafer movement, whereas during processing the decreased or increased flows of medium are directed to the centre of wafer processing. These flows are combined with regulation of the adapted negative pressure or vacuum in the discharge of such medium.

Preferably, each group of recesses 20 on both sides of the lateral centre of the tunnel passageway is connected with its own supply channels 84 86, see FIG. 1.

By variation of the supply pressure for the processing medium the wafer 18 can oscillate in lateral direction for optimal processing.

In supply channels 84 and 86 the respective flow restrictions 88 and 90 are located to provide a more uniform flow of medium towards the recesses in the upper and lower blocks 12 and 14.

Figure 4:
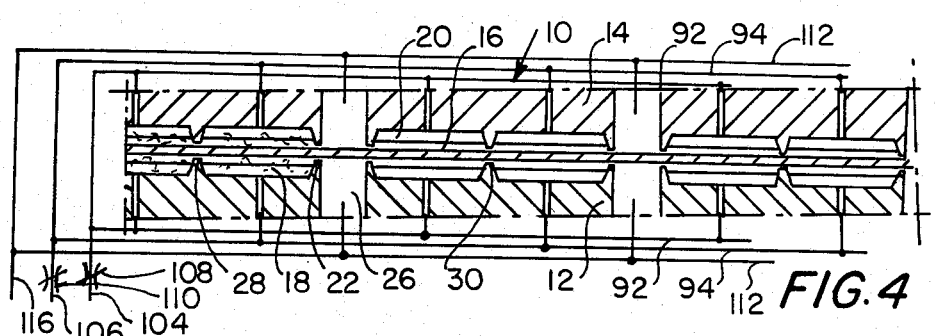
FIG. 4 is a vertical section taken along line 4—4 of FIG. 2
Figure 5:
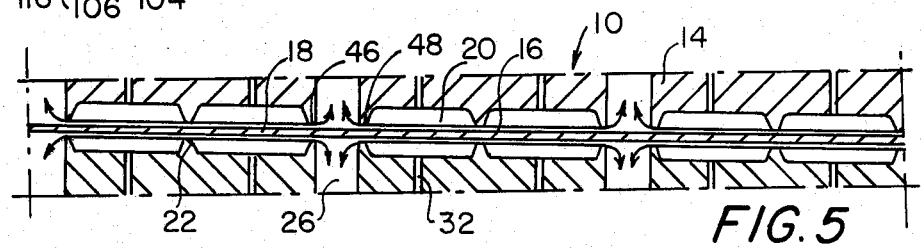
FIG. 5 is a vertical section taken along line 5—5 of FIG. 2.
Figure 7:
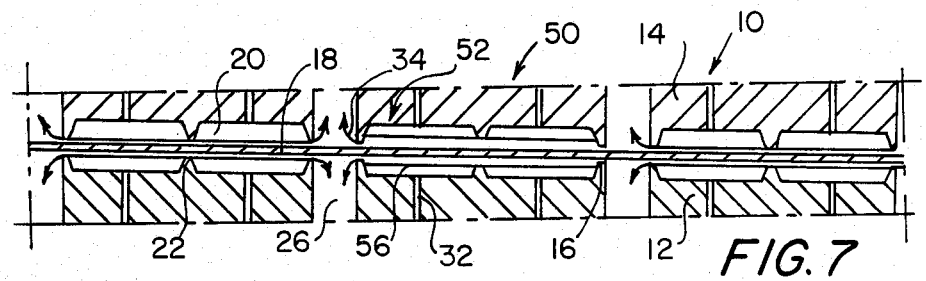
FIG. 7 is a vertical section taken along line 7—7 of FIG. 6.
Figure 9:
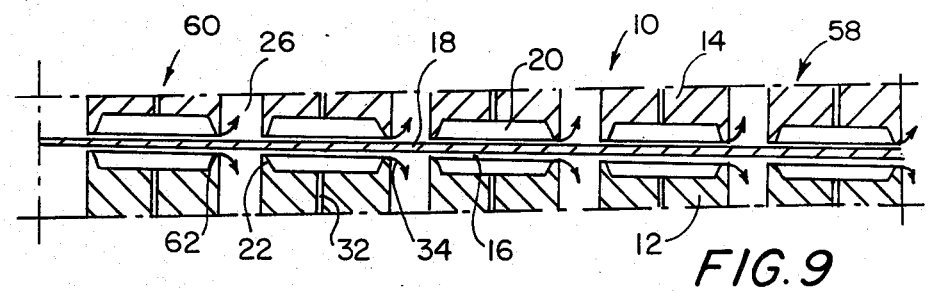
FIG. 9 is a vertical section taken along line 9—9 of FIG. 8.

Furthermore, per block 12 and 14 the supply channels, as for instance channels 84 and 86, are connected with a common main supply channel, such as channels 92, 94, 96 and 98, which preferably are located aside these blocks in the communication blocks 100 and 102, see FIG. 1 and FIG. 4.

These channels are connected with the common supply channels 104 and 106, wherein the adjustable flow restrictor 108 and 110 can be positioned.

Groups of discharge channels 26 can be connected with the common discharges 112 and 114, which in turn are connected with the main discharge 116.

Within the scope of the invention variations are possible in the shown designs.

Furthermore, any inclination and number of supply and discharge channels are possible.

I claim:

1. Method of double floating transport and processing of a substrate within a confined passageway comprising:
   a. flowing fluid medium longitudinally within a confined passageway via a series of laterally extending gaseous medium supply channel and discharge channels intersecting the top and bottom of said passageway in longitudinal series;
   b. introducing the substrate into an end of said passageway, so as to be supported and transported in double floating condition by said flowing fluid medium; while
   c. restricting flowing of said fluid medium into said passageway, so as to guide said substrate during transport by flowing said fluid medium through a plurality of concavities extending transversely across the top and bottom of said passageway, such that the presence of said substrate increases adjacent fluid medium pressure.

2. Method of double floating transport and processing of a substrate within a confined passageway as in claim 1, said flowing of fluid medium being both in the direction of transport and oppositely thereto.

3. Method of double floating transport and processing of a substrate within a confined passageway as in claim 2, said flowing of fluid medium being in the form of thrusts imparting transport to said substrate.

4. Method of double floating transport and processing of a substrate within a confined passageway as in claim 2, said flowing of fluid medium oppositely to the direction of transport being smaller than said flowing in the direction of transport.

5. Method of double floating transport and processing of a substrate within a confined passageway as in claim 2, said flowing of fluid medium during processing of said substrate being in the form of thrusts which maintain said substrate in double floating condition within a processing section, including flowing of fluid medium against the direction of transport during said processing.

6. Method of double floating transport and processing of a substrate within a confined passageway as in claim 5, including rotating said substrate during processing by flowing said fluid medium in opposite directions upon said substrate.

* * * * *